(12) United States Patent
Noda et al.

(10) Patent No.: US 9,531,160 B2
(45) Date of Patent: Dec. 27, 2016

(54) TWO-DIMENSIONAL PHOTONIC CRYSTAL SURFACE-EMITTING LASER

(71) Applicant: JAPAN SCIENCE AND TECHNOLOGY AGENCY, Kawaguchi-shi, Saitama (JP)

(72) Inventors: Susumu Noda, Kyoto (JP); Tsuyoshi Okino, Yasu (JP); Kyoko Kitamura, Kyoto (JP); Yoshinori Tanaka, Kyoto (JP); Yong Liang, Zurich (CH)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 0 days.

(21) Appl. No.: 14/773,584

(22) PCT Filed: Feb. 25, 2014

(86) PCT No.: PCT/JP2014/054429
§ 371 (c)(1),
(2) Date: Sep. 8, 2015

(87) PCT Pub. No.: WO2014/136607
PCT Pub. Date: Sep. 12, 2014

(65) Prior Publication Data
US 2016/0261093 A1 Sep. 8, 2016

(30) Foreign Application Priority Data

Mar. 8, 2013 (JP) ................................ 2013-046564

(51) Int. Cl.
| H01S 5/00 | (2006.01) |
|---|---|
| H01S 5/18 | (2006.01) |

(Continued)

(52) U.S. Cl.
CPC ............... *H01S 5/18* (2013.01); *H01S 3/0085* (2013.01); *H01S 3/10* (2013.01); *H01S 5/0425* (2013.01); *H01S 5/105* (2013.01)

(58) Field of Classification Search
CPC ............ H01S 5/18; H01S 3/0085; H01S 3/10; H01S 5/0425; H01S 5/105
See application file for complete search history.

(56) References Cited

U.S. PATENT DOCUMENTS

| 7,876,800 B2 | 1/2011 | Ikuta |
|---|---|---|
| 8,619,830 B2 | 12/2013 | Noda et al. |

(Continued)

FOREIGN PATENT DOCUMENTS

| JP | 2008-216883 A | 9/2008 | |
|---|---|---|---|
| JP | 2008216883 A * | 9/2008 | ............... H01S 5/10 |

(Continued)

OTHER PUBLICATIONS

Matsubara et al., "GaN Photonic-Crystal Surface-Emitting Laser at Blue-Violet Wavelengths," Science, Jan. 25, 2008, vol. 319, pp. 445-447.

(Continued)

*Primary Examiner* — Yuanda Zhang
(74) *Attorney, Agent, or Firm* — Oliff PLC

(57) ABSTRACT

A two-dimensional photonic crystal surface emitting laser has a laminated structure including: a two-dimensional photonic crystal (2DPC) layer in which refractive index distribution is formed by two-dimensionally arranging air holes in a plate-shaped base member; and an active layer for generating light with wavelength $\lambda_L$ by receiving an injection of electric current. The two-dimensional photonic crystal surface emitting laser emits a laser beam in the direction of an inclination angle $\theta$ from normal to the 2DPC layer.

12 Claims, 12 Drawing Sheets

(51) Int. Cl.
  H01S 5/042 (2006.01)
  H01S 5/10 (2006.01)
  H01S 3/00 (2006.01)
  H01S 3/10 (2006.01)

(56) References Cited

U.S. PATENT DOCUMENTS

| | | |
|---|---|---|
| 2009/0232179 A1 | 9/2009 | Ikuta |
| 2011/0188526 A1 | 8/2011 | Noda et al. |
| 2013/0039375 A1 | 2/2013 | Noda et al. |
| 2013/0243026 A1* | 9/2013 | Noda ............... H01S 5/1234 372/50.12 |

FOREIGN PATENT DOCUMENTS

| | | |
|---|---|---|
| JP | 2008-288558 A | 11/2008 |
| JP | 2009-076900 A | 4/2009 |
| JP | 2013-041948 A | 2/2013 |

OTHER PUBLICATIONS

Iwahashi et al., "Comprehensive Investigation of Composite Photonic-Crystal Cavities Emitting Arbitrary-Angled Laser Beams," Photonics Conference, 2011 IEEE, Oct. 9, 2011, pp. 521-522.

Mar. 29, 2016 Extended Search Report issued in European Patent Application No. 14760954.9.

Nobuoka, Toshiyuki et al., "Two-Dimensional Beam-Steering using Square Lattice M Point Photonic Crystal Resonator", The Japan Society of Applied Physics and Related Societies extended abstracts of the 59th meeting, The Japan Society of Applied Physics, issued on Feb. 29, 2012, Meeting No. 16a-E5-2.

May 27, 2014 Search Report issued in International Patent Application No. PCT/JP2014/054429.

Okino, Takeshi et al., "Photonic Kessho Laser no beam Shussha Hoko Seigyo-Hencho Photonic Kessho Kozo no Donyu-", The Japan Society of Applied Physics Shunki Gakujutsu Koenkai Koen Yokoshu, Mar. 11, 2013, vol. 60, 28p-C1-17.

Aug. 26, 2016 Office Action issued in U.S. Appl. No. 15/050,993.

* cited by examiner $\lambda_L = 987.4$nm、INCLINATION ANGLE $\theta = 36.2°$ (DESIGN VALUE)、$\delta\Psi_x = 3\pi/4$、$\delta\Psi_y = \pi$

|←— 1μm —→|

Fig. 5A-1
$\lambda_L$=987.4nm、 INCLINATION ANGLE $\theta$=30° (DESIGN VALUE)
$\delta\Psi_x$=0.792$\pi$、 $\delta\Psi_y$=$\pi$

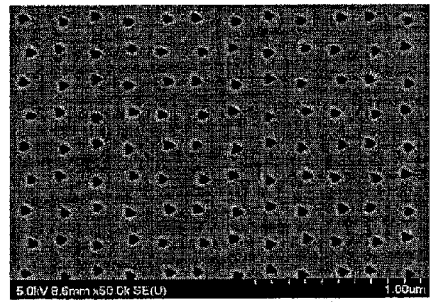

Fig. 5A-2
$\lambda_L$=987.4nm、 DESIGN INCLINATION ANGLE $\theta$=40° (DESIGN VALUE)
$\delta\Psi_x$=0.733$\pi$、 $\delta\Psi_y$=$\pi$

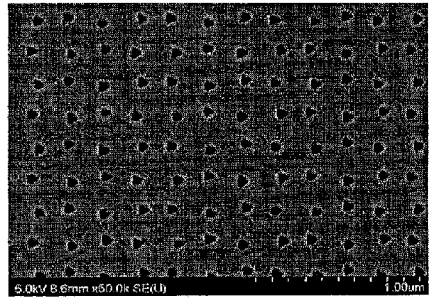

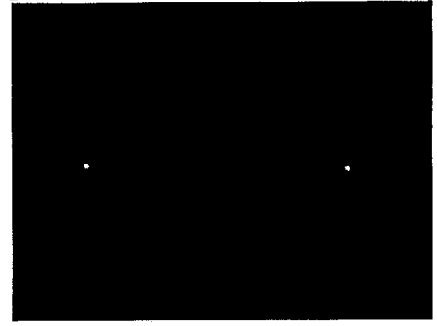

$\theta$=29.5° (ACTUAL MEASUREMENT VALUE)

$\theta$=39.2° (ACTUAL MEASUREMENT VALUE)

Fig. 6

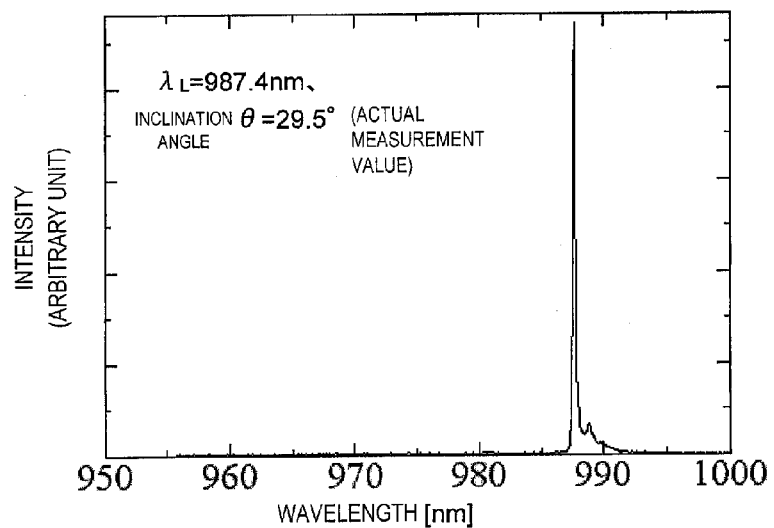

$\lambda_L$=987.4nm、 INCLINATION ANGLE $\theta$=29.5° (ACTUAL MEASUREMENT VALUE)

INTENSITY (ARBITRARY UNIT)

WAVELENGTH [nm]

$\lambda_L$=987.4nm, INCLINATION ANGLE $\theta$=30°, AZIMUTHAL ANGLE $\phi$=60°
(DESIGN VALUE)

$\lambda_L$=987.4nm, INCLINATION ANGLE $\theta$=30°, AZIMUTHAL ANGLE $\phi$=90°
(DESIGN VALUE)

$\theta$=29.5°, $\phi$=60° (ACTUAL MEASUREMENT VALUE)

$\theta$=29.5°, $\phi$=90° (ACTUAL MEASUREMENT VALUE)

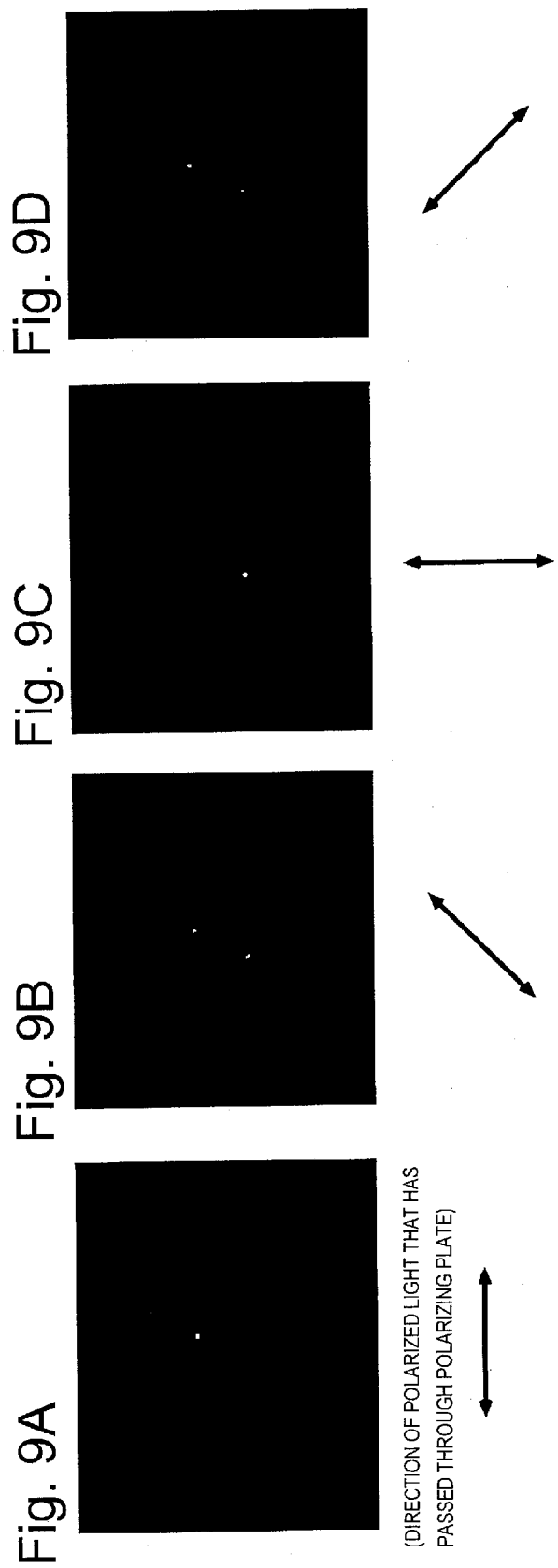

$\delta \Psi_x = \delta \Psi_{xA}$    $\delta \Psi_x = \delta \Psi_{xB}$    $\delta \Psi_x = \delta \Psi_{xC}$
$\delta \Psi_y = \pi$    $\delta \Psi_y = \pi$    $\delta \Psi_y = \pi$ Fig. 13A-1
SHIFT OF AIR HOLE:
x DIRECTION, θ=30°, φ=0°
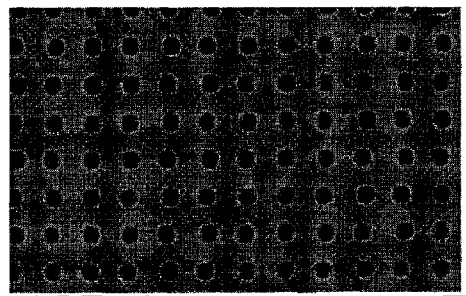
Fig. 13A-2
SHIFT OF AIR HOLE:
y DIRECTION, θ=30°, φ=0°
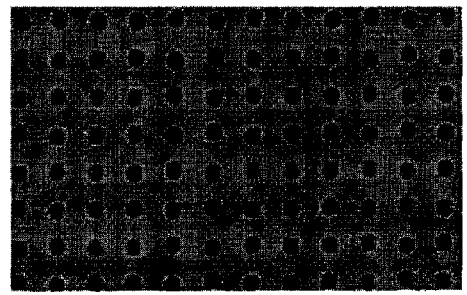
Fig. 13B-1
x DIRECTION, θ=30°, φ=0°
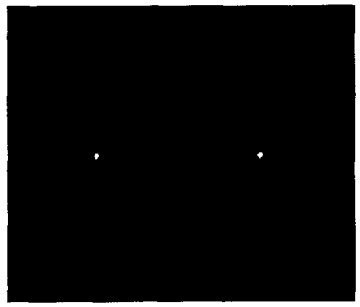
Fig. 13B-2
y DIRECTION, θ=30°, φ=0°
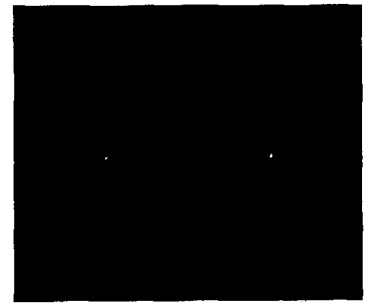
SHIFT OF AIR HOLE:
135-DEGREE DIRECTION FROM x DIRECTION, θ=30°, φ=0°
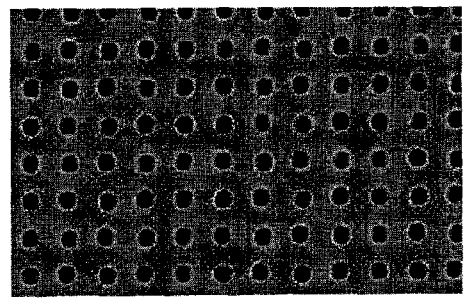
Fig. 13A-3
135-DEGREE DIRECTION FROM x DIRECTION, θ=30°, φ=0°
Fig. 13B-3

Fig. 14A
SHIFT OF AIR HOLE: x DIRECTION
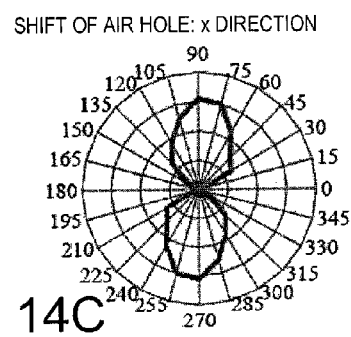
Fig. 14B
SHIFT OF AIR HOLE: y DIRECTION
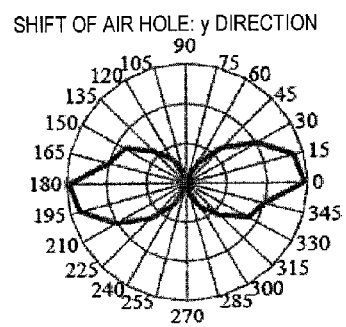
Fig. 14C
SHIFT OF AIR HOLE: 135-DEGREE DIRECTION FROM x DIRECTION
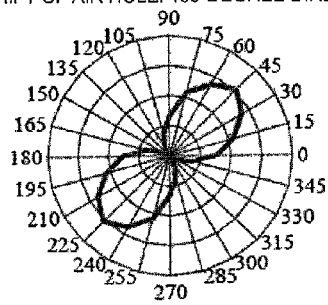
Fig. 15A
SHIFT OF AIR HOLE: x DIRECTION 、 $\theta=30°$ 、 $\phi=0°$
Fig. 15B
SHIFT OF AIR HOLE: x DIRECTION 、 $\theta=30°$ 、 $\phi=45°$
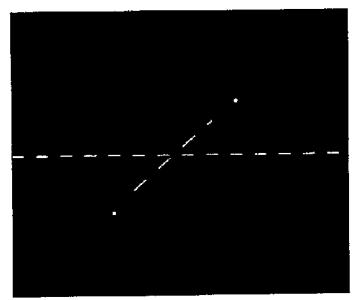
SHIFT OF AIR HOLE: x DIRECTION 、 $\theta=30°$ 、 $\phi=90°$
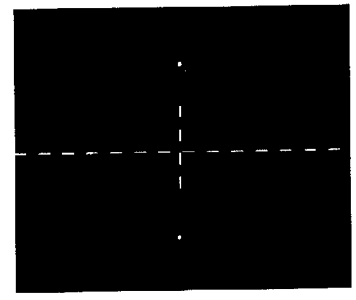
Fig. 15C

TWO-DIMENSIONAL PHOTONIC CRYSTAL SURFACE-EMITTING LASER

TECHNICAL FIELD

The present invention relates to a two-dimensional photonic crystal surface emitting laser, and more specifically, to a two-dimensional photonic crystal surface emitting laser that emits a laser beam in a direction inclined from the normal to a crystal surface.

BACKGROUND ART

Semiconductor lasers have many advantages, such as small, inexpensive, low power consumption and long service life, and they are used in a wide variety of fields, such as light sources for optical recording, light sources for communication, laser displays, laser printers, and laser pointers. In typical laser displays or laser printers, the laser beam is controlled to scan a certain region so as to form characters or figures. In currently used semiconductor lasers, the scan operation is achieved by controlling the emitting direction of the laser beam by using an additional, external element, such as a polygon mirror, a micro electro-mechanical system (MEMS) micro mirror or an acousto-optic device. However, adding such a scanning mechanism prevents miniaturization of the devices using a semiconductor laser, and works against improvements in their operational speed and durability.

Patent Literature 1 and Non Patent Literature 1 each describe a two-dimensional photonic crystal surface emitting laser whose laser beam emitting direction is variable (which is hereinafter called the "variable beam-direction two-dimensional photonic crystal surface emitting laser").

Before describing the variable beam-direction two-dimensional photonic crystal surface emitting laser, description will be first made to a typical two-dimensional photonic crystal surface emitting laser (whose beam emitting direction is normal to the crystal surface and is not variable). The typical two-dimensional photonic crystal surface emitting laser includes: an active layer; and a two-dimensional photonic crystal layer which includes regions periodically arranged in a plate-shaped member, where the refractive index of the regions differs from that of the plate-shaped member. The region is called "modified refractive index region", and is typically an air hole. In the two-dimensional photonic crystal surface emitting laser, when electric charges are injected into the active layer, light is generated within a wavelength range determined by the material of the active layer. Among the light generated in the active layer, light having a predetermined wavelength determined by the spatial period of the modified refractive index regions forms a standing wave in the two-dimensional photonic crystal layer, whereby the light is amplified. The light thus amplified is scattered by the modified refractive index regions in various directions within the two-dimensional photonic crystal layer. Depending on the spatial period of the modified refractive index regions, two rays of light that are respectively scattered by two neighboring modified refractive index regions in the direction normal to the two-dimensional photonic crystal layer may have an optical path difference equal to their wavelength, and these rays of scattered light may be in phase. If this condition is satisfied, a laser beam is emitted in the direction perpendicular to the two-dimensional photonic crystal layer.

The variable beam-direction two-dimensional photonic crystal surface emitting laser described in Patent Literature 1 includes: an active layer; and two two-dimensional photonic crystal layers that differ from each other in the spatial period of the modified refractive index regions. Accordingly, in the two two-dimensional photonic crystal layers respectively, lights having different wavelengths corresponding to the respective spatial periods of the modified refractive index regions form standing waves, and are amplified. Due to the wavelength difference (or frequency difference) between the standing waves, a spatial beat occurs, causing the resultant laser beam to be inclined with respect to the normal to the two-dimensional photonic crystal layers. Such an obliquely emitted laser beam is hereinafter called the "inclined beam". The angle (inclination angle) of the inclined beam with respect to the normal to the two-dimensional photonic crystal layers increases as the aforementioned frequency difference increases. Hence, the modified refractive index regions can be formed to have different spatial period in at least one of the two-dimensional photonic crystal layers depending on the in-plane position, whereby it is possible to create an inclined beam whose inclination angle varies depending on the position at which electric charges are injected into the active layer (the in-plane position at which the laser oscillation occurs).

The variable beam-direction two-dimensional photonic crystal surface emitting laser described in Non Patent Literature 1 includes: an active layer; and one two-dimensional photonic crystal layer in which modified refractive index regions are arranged at lattice points formed by superposing a square lattice and an orthorhombic lattice. According to Non Patent Literature 1, the square lattice is responsible for forming a resonant state of light generated in the active layer within the two-dimensional photonic crystal layer, and the orthorhombic lattice is responsible for emitting the resonant light in a direction inclined from the normal to the two-dimensional photonic crystal layer.

CITATION LIST

Patent Literature

[Patent Literature 1] JP 2009-076900 A

Non Patent Literature

[Non Patent Literature 1] Toshiyuki Nobuoka and three others, "Two-dimensional beam-direction control by photonic-crystal lasers with square-lattice M-point oscillation", The Japan Society of Applied Physics and Related Societies extended abstracts of the $59^{th}$ meeting, The Japan Society of Applied Physics, issued on Feb. 29, 2012, Meeting No. 16a-E5-2

SUMMARY OF INVENTION

Technical Problem

In the variable beam-direction two-dimensional photonic crystal surface emitting laser described in Patent Literature 1, two kinds of two-dimensional photonic crystals each emitting a laser beam in the direction perpendicular to the two-dimensional photonic crystal layers are combined. This is a kind of restriction which makes it difficult to increase the inclination angle.

In the variable beam-direction two-dimensional photonic crystal surface emitting laser described in Non Patent Literature 1, the resonant light formed by the square lattice is scattered by the orthorhombic lattice in various directions.

Accordingly, in addition to an inclined beam having an intended inclination angle, light is scattered in directions different from the intended inclination angle, which makes a loss in the generated light.

A problem to be solved by the present invention is to provide a two-dimensional photonic crystal surface emitting laser that can emit an inclined beam at a larger inclination angle with a smaller loss in light than that in conventional cases.

Solution to Problem

A two-dimensional photonic crystal surface emitting laser according to the present invention aimed at solving the aforementioned problem is a two-dimensional photonic crystal surface emitting laser comprising a laminated structure including: an active layer for generating light having a wavelength $\lambda_L$ by receiving an injection of an electric current; and a two-dimensional photonic crystal layer in which refractive index distribution is formed by modified refractive index regions two-dimensionally arranged in a plate-shaped base member, where the refractive index of the modified refractive index regions differs from that of the base member, wherein the modified refractive index regions in the two-dimensional photonic crystal layer are modulated at respective lattice points of a basic two-dimensional lattice whose periodicity is determined such that a resonant state of the light having the wavelength $\lambda_L$ is created by forming a two-dimensional standing wave while the light having the wavelength $\lambda_L$ is prevented from being emitted to an outside, and a modulation phase $\Psi$ at each lattice point is expressed as $\Psi = r\uparrow \cdot G'\uparrow$ by using a position vector $r\uparrow$ of each lattice point and a reciprocal lattice vector $G'\uparrow = (g'_x, g'_y) = (k_x \pm |k\uparrow|(\sin\theta \cos\phi)/n_{e\!f\!f}, k_y \pm |k\uparrow|(\sin\theta \sin\phi)/n_{e\!f\!f})$, the reciprocal lattice vector $G'\uparrow$ being expressed by using: a wave vector $k\uparrow = (k_x, k_y)$ of the light having the wavelength $\lambda_L$ in the two-dimensional photonic crystal layer; an effective refractive index $n_{e\!f\!f}$ of the two-dimensional photonic crystal layer; and an azimuthal angle $\phi$ from a predetermined reference line of the basic two-dimensional lattice, whereby the two-dimensional photonic crystal surface emits laser emits a laser beam in a direction of an inclination angle $\theta$ from the normal to the two-dimensional photonic crystal layer.

The active layer contains a component for generating light in a wavelength range including the wavelength $\lambda_L$.

The two-dimensional photonic crystal surface emitting laser according to the present invention may further include a cladding layer and a spacer layer in addition to the active layer and the two-dimensional photonic crystal layer.

The wavelength $\lambda_L$ is defined as the wavelength in vacuum. The wavelength in the two-dimensional photonic crystal layer (which is hereinafter called the "in-crystal-layer wavelength $\lambda_{PC}$") of the light having the wavelength $\lambda_L$ is $\lambda_{PC} = \lambda_L/n_{e\!f\!f}$. Here, $n_{e\!f\!f}$ is an effective refractive index determined by taking account of: the ratio of the electric field intensity of light distributed over the two-dimensional photonic crystal layer in the laminated structure of the aforementioned layers; and the filling ratio of the modified refractive index regions to the base member.

Hereinafter, (1) the basic two-dimensional lattice and (2) the modulation in the present invention are described.

(1) Basic Two-Dimensional Lattice

The basic two-dimensional lattice, that is, the two-dimensional lattice for creating the resonant state of the light having the wavelength $\lambda_L$ while preventing the light having the wavelength $\lambda_L$ from being emitted to the outside has been known up to now. A square lattice having a lattice constant a $$a = 2^{-1/2}\lambda_L/n_{e\!f\!f} = 2^{-1/2}\lambda_{PC}$$

can be taken as an example of the basic two-dimensional lattice. Moreover, a rectangular lattice (including a face-centered rectangular lattice) having lattice constants $a_1$ and $a_2$ that satisfy the relational expression $$(\tfrac{1}{2}) \times (a1^{-2} + a_2^{-2})^{1/2} = 1/\lambda_{PC}$$

and a triangular lattice having a lattice constant a $$a = (\tfrac{2}{3})\lambda_{PC}$$

can also be taken as examples of the basic two-dimensional lattice.

With reference to FIG. 1A and FIG. 1B, the reason why such a basic two-dimensional lattice amplifies the light having the wavelength $\lambda_L$ while preventing the light having the wavelength $\lambda_L$ from being emitted to the outside is described by taking, as an example, the square lattice that satisfies the aforementioned expression $a = 2^{-1/2}\lambda_{PC}$.

In a two-dimensional photonic crystal layer, if modified refractive index regions are respectively arranged at lattice points 91 of the square lattice of a basic two-dimensional lattice 90, light having the in-crystal-layer wavelength $\lambda_{PC}$ is scattered in various directions. Among these rays of scattered light, light L1 that is scattered at one lattice point 911 in the direction different by 180° from the previous traveling direction ("180°-scattering") and light L2 that is 180°-scattered at each of four lattice points 912 closest to the lattice point 911 have an optical path difference equal to the in-crystal-layer wavelength $\lambda_{PC}$, and hence the light is amplified due to interference (FIG. 1A, in which only the light L2 scattered at one of the lattice points 912 is illustrated). Moreover, light L3 that is scattered at the lattice point 911 in a direction different by 90° from the previous traveling direction ("90°-scattering") in the lattice plane and light L4 that is 90°-scattered at each of the four lattice points 912 in the lattice plane also have an optical path difference equal to the in-crystal-layer wavelength $\lambda_{PC}$, and hence the light is amplified due to interference (FIG. 1A). In this way, a two-dimensional standing wave is formed by both the 180°-scattering and the 90°-scattering, whereby the light is amplified.

The light having the in-crystal-layer wavelength $\lambda_{PC}$ and propagating through the two-dimensional photonic crystal layer is also scattered at the lattice points 91 in a direction at an angle from the plane of the layer. However, for such rays of scattered light, light scattered at the lattice point 911 and light scattered at each of the lattice points 912 have an optical path difference of $\lambda_{PC}/2$ (light L5 and light L6 in FIG. 1B), and the two rays of light become out of phase with each other by $\pi$ to cancel each other. Accordingly, the light is prevented from being emitted to the outside of the two-dimensional photonic crystal layer.

Although the case where the basic two-dimensional lattice is the square lattice is described here as an example, the same applies to the rectangular lattice. In the case where the basic two-dimensional lattice is the triangular lattice (hexagonal lattice), the same as the case of the square lattice applies except that the light amplified due to interference is light that is scattered in a direction different by 120° from the previous traveling direction ("120°-scattering") in the lattice plane.

(2) Modulation

As described above, the modified refractive index regions are modulated at respective lattice points. In the present invention, the term "modulation" means that a periodical change is given in a spatial period (modulation period) different from the spatial period of the basic two-dimensional lattice, to the state where the modified refractive index regions in the same form are respectively arranged at the exact lattice points of the basic two-dimensional lattice. This periodical change can be made by, for example, arranging the modified refractive index region at each lattice point with its position being shifted from the lattice point and periodically changing the direction or/and the magnitude of the shift with the modulation period. Alternatively, this periodical change can also be made by periodically changing the area of the modified refractive index region with the modulation period.

The modulation at each lattice point of the basic two-dimensional lattice can be represented by the phase $\Psi$ (modulation phase). The modulation phase $\Psi$ at each lattice point is determined by the position vector $\vec{r}$ of each lattice point of the basic two-dimensional lattice and the reciprocal lattice vector $\vec{G'}$. This reciprocal lattice vector $\vec{G'}$ just corresponds to the reciprocal lattice vector in the orthorhombic lattice in Non Patent Literature 1. However, in the present invention, a lattice corresponding to this reciprocal lattice vector $\vec{G'}$ does not exist, and, instead, the modified refractive index region is modulated at each lattice point of the basic two-dimensional lattice. In the present invention, this modulation of the modified refractive index region at each lattice point includes both the position (the shift from the lattice point) of the modified refractive index region and the area of the modified refractive index region. Specific description thereof is given below.

(i) The modified refractive index region arranged at each lattice point is shifted by the same distance from the lattice point, and the angle to the predetermined reference line of the basic two-dimensional lattice is modulated based on the modulation phase $\Psi$, the angle representing the direction of the shift. In this case, the value of this angle is $\Psi$, and varies between 0 to $2\pi$.

(ii) The modified refractive index region arranged at each lattice point is shifted in the same direction from the lattice point, and an absolute value of a distance d of the shift is modulated between zero and a maximum value $d_{max}$, based on the modulation phase $\Psi$. Specifically, this is expressed as $d=d_{max} \sin \Psi$.

(iii) The modified refractive index region is arranged at each exact lattice point, and the area S of each modified refractive index region is modulated between a minimum value $(S_0-S')$ and a maximum value $(S_0+S')$, based on the modulation phase $\Psi$. Specifically, this is expressed as $S=S_0+S' \sin \Psi$.

In the case where the basic two-dimensional lattice is the square lattice having the lattice constant a, the modulation phase $\Psi$ at each lattice point is obtained in the following manner. First, the position vector $\vec{r}$ of the lattice point is expressed as $\vec{r}=(m_x a, m_y a)$ by using integers $m_x$ and $m_y$ in an orthogonal coordinate system. In this case, the wave vector $\vec{k}$ is $\vec{k}=(\pi/a, \pi/a)$, and the reciprocal lattice vector $G'=(g'_x, g'_y)$ is

[Expression 1]

$$g'_x = \left( \frac{1}{2} \pm \frac{1}{\sqrt{2}\, n_{eff}} \sin \theta \cos \phi \right) \cdot \frac{2\pi}{a} \quad (1)$$

$$g'_y = \left( \frac{1}{2} \pm \frac{1}{\sqrt{2}\, n_{eff}} \sin \theta \sin \phi \right) \cdot \frac{2\pi}{a}$$

Accordingly, the modulation phase $\Psi=\vec{r}\cdot\vec{G'}$ at each lattice point in this case is

[Expression 2]

$$\Psi = 2\pi \left[ \left( \frac{1}{2} \pm \frac{1}{\sqrt{2}\, n_{eff}} \sin \theta \cos \phi \right) m_x + \left( \frac{1}{2} \pm \frac{1}{\sqrt{2}\, n_{eff}} \sin \theta \sin \phi \right) m_y \right]. \quad (2)$$

Similarly, in the case where the basic two-dimensional lattice is the rectangular lattice having the lattice constants $a_1$ and $a_2$, the position vector $\vec{r}$ of the lattice point is expressed as $\vec{r}=(m_x a_1, m_y a_2)$ by using the integers $m_x$ and $m_y$ in an orthogonal coordinate system. The reciprocal lattice vector $G'=(g'_x, g'_y)$ is

[Expression 3]

$$g'_x = \left( \frac{1}{a_1} \pm \sqrt{\frac{1}{a_1^2} + \frac{1}{a_2^2}} \, \frac{\sin \theta \cos \phi}{n_{eff}} \right) \cdot \pi \quad (3)$$

$$g'_y = \left( \frac{1}{a_2} \pm \sqrt{\frac{1}{a_1^2} + \frac{1}{a_2^2}} \, \frac{\sin \theta \sin \phi}{n_{eff}} \right) \cdot \pi,$$

and the modulation phase $\Psi=\vec{r}\cdot\vec{G'}$ at each lattice point is

[Expression 4]

$$\Psi = \pi \left[ \left( 1 \pm \sqrt{1 + \frac{a_1^2}{a_2^2}} \, \frac{\sin \theta \cos \phi}{n_{eff}} \right) m_x + \left( 1 \pm \sqrt{1 + \frac{a_2^2}{a_1^2}} \, \frac{\sin \theta \sin \phi}{n_{eff}} \right) m_y \right]. \quad (4)$$

In the case where the basic two-dimensional lattice is the triangular lattice having the lattice constant a, the position vector $\vec{r}$ of the lattice point is expressed as $\vec{r}=(m_1 a+(\tfrac{1}{2})m_2 a, (3^{1/2}/2)m_2 a)$ by using the integers $m_1$ and $m_2$ in an orthogonal coordinate system. The reciprocal lattice vector is any of the combination of

[Expression 5]

$$g'_x = \left( 1 \pm \frac{\sin \theta \cos \phi}{n_{eff}} \right) \cdot \frac{4\pi}{3a} \quad (5)$$

$$g'_y = \pm \frac{\sin \theta \cos \phi}{n_{eff}} \cdot \frac{4\pi}{3a}$$

and the combination of

[Expression 6]

$$g'_x = \left(1 \pm 2\frac{\sin\theta\cos\phi}{n_{eff}}\right) \cdot \frac{2\pi}{3a} \quad (6)$$

$$g'_y = \left(\sqrt{3} \pm 2\frac{\sin\theta\sin\phi}{n_{eff}}\right) \cdot \frac{2\pi}{3a}.$$

In the case where G↑ is the former combination, the modulation phase Ψ=r↑·G'↑ at each lattice point is

[Expression 7]

$$\Psi = \left(1 \pm \frac{\sin\theta\cos\phi}{n_{eff}}\right) \cdot \frac{4\pi}{3}\left(m_1 + \frac{1}{2}m_2\right) \pm \frac{\sin\theta\cos\phi}{n_{eff}} \cdot \frac{2\sqrt{3}\pi}{3}m_2. \quad (7)$$

In the case where G↑ is the latter combination, the modulation phase Ψ=r↑·G'↑ at each lattice point is

[Expression 8]

$$\Psi = \left(1 \pm 2\frac{\sin\theta\cos\phi}{n_{eff}}\right) \cdot \frac{2\pi}{3}\left(m_1 + \frac{1}{2}m_2\right) + \quad (8)$$

$$\left(\sqrt{3} \pm 2\frac{\sin\theta\sin\phi}{n_{eff}}\right) \cdot \frac{\sqrt{3}\pi}{3}m_2.$$

(3) Operation of Two-Dimensional Photonic Crystal Surface Emitting Laser According to Present Invention The operation of the two-dimensional photonic crystal surface emitting laser according to the present invention is described. When an electric current is injected into the active layer, light having the wavelength $\lambda_L$ is generated, and the light forms a standing wave in the two-dimensional photonic crystal layer due to the periodicity of the basic two-dimensional lattice. Consequently, the in-phase rays of light having the wavelength $\lambda_L$ are amplified. According to the refractive index distribution modulated based on the modulation phase Ψ, the light thus amplified is diffracted with the reciprocal lattice vector G'↑ being a diffraction vector, and the light is emitted while being inclined with respect to the normal to the two-dimensional photonic crystal layer. The emitted light is in-phase laser beams having the same wavelength.

In the two-dimensional photonic crystal surface emitting laser according to the present invention, as described above, the modified refractive index regions are respectively arranged at positions shifted from the lattice points of one basic two-dimensional lattice, instead of superposing a plurality of lattice structures on each other. Hence, unlike the laser described in Patent Literature 1, there is no restriction to combine two kinds of two-dimensional photonic crystals emitting a laser beam in the direction perpendicular to the two-dimensional photonic crystal layers. For the same reason, in the two-dimensional photonic crystal surface emitting laser according to the present invention, unlike the laser described in Non Patent Literature 1, unnecessary scattering is not caused by the orthorhombic lattice superposed on the square lattice (corresponding to the basic two-dimensional lattice of the present invention).

The two-dimensional photonic crystal surface emitting laser according to the present invention can have such a configuration that: the modified refractive index region arranged at each lattice point is shifted by the same distance from the lattice point; and the angle to the predetermined reference line of the basic two-dimensional lattice is modulated based on the modulation phase Ψ, the angle representing the direction of the shift. Modulation is given to the direction of the shift in this way, whereby emitted light having circularly polarized light can be obtained.

Alternatively, the two-dimensional photonic crystal surface emitting laser according to the present invention can have such a configuration that: the modified refractive index region arranged at each lattice point is shifted in the same direction from the lattice point; and the absolute value of the distance d of the shift is modulated between zero and the maximum value $d_{max}$, based on the modulation phase Ψ. Each modified refractive index region is shifted in the same direction in this way, whereby emitted light including linearly polarized light in the direction perpendicular to the direction of the shift can be obtained.

The two-dimensional photonic crystal surface emitting laser according to the present invention further comprises
 a current-injecting position controller for controlling a position at which the electric current is injected into the active layer (current-injecting position), wherein
 the modulation phase Ψ of each lattice point differs for each modulation region in the two-dimensional photonic crystal layer, the modulation region being a region in which light emission from the current-injecting position is amplified. As a result, a variable beam-direction two-dimensional photonic crystal surface emitting laser can be obtained. That is, in this variable beam-direction two-dimensional photonic crystal surface emitting laser, light generated by injecting, by the current-injecting position controller, the electric current into a given region (different from the modified refractive index regions) of the active layer is introduced into a portion of the two-dimensional photonic crystal layer, the portion corresponding to the given region. Then, an inclined beam is emitted at the inclination angle θ and the azimuthal angle ϕ determined by the modulation phase Ψ at the position of the portion of the two-dimensional photonic crystal layer into which the light is introduced.

In the variable beam-direction two-dimensional photonic crystal surface emitting laser, the current-injecting position controller can include: a plurality of electrodes including a pair of electrodes arranged so as to sandwich the active layer and the two-dimensional photonic crystal layer, one or both of the pair of electrodes being one-dimensionally or two-dimensionally arranged in parallel to the active layer and the two-dimensional photonic crystal layer; and a switch for switching electrodes for injecting the electric current into the active layer, among the plurality of electrodes. In particular, when the two-dimensionally arranged electrodes are used, a larger number of modulation regions can be provided and a larger number of combinations of the inclination angle θ and the azimuthal angle ϕ can be set than when the one-dimensionally arranged electrodes are used.

Advantageous Effects of Invention

According to the present invention, it is possible to obtain a two-dimensional photonic crystal surface emitting laser that can emit an inclined beam at a larger inclination angle with a smaller loss in light than that in conventional cases.

BRIEF DESCRIPTION OF DRAWINGS

FIG. 5A-1 and FIG. 5A-2 are microscopic pictures respectively showing two-dimensional photonic crystal layers in two-dimensional photonic crystal surface emitting lasers of the first embodiment in which the wavelength $\lambda_L$ is 987.4 nm and the design values of the inclination angle θ are 30° and 40°, and FIG. 5B-1 and FIG. 5B-2 are respective far-field images of obtained inclined beams.

FIG. 6 is an oscillation spectrum obtained using the two-dimensional photonic crystal surface emitting laser of the first embodiment in which the wavelength $\lambda_L$ is 987.4 nm and the design value of the inclination angle θ is 30°.

FIG. 7A-1 and FIG. 7A-2 are microscopic pictures respectively showing two-dimensional photonic crystal layers in two-dimensional photonic crystal surface emitting lasers of the first embodiment in which the wavelength $\lambda_L$ is 987.4 nm, the design value of the inclination angle θ is 30°, and the design values of an azimuthal angle are 60° and 90°, and FIG. 7B-1 and FIG. 7B-2 are respective far-field images of obtained inclined beams.

FIG. 9A, FIG. 9B, FIG. 9C, and FIG. 9D are respective far-field images of the inclined beams that have passed through a quarter-wavelength plate and then a polarizing plate, in the same two-dimensional photonic crystal surface emitting laser as that of FIG. 8.

FIG. 13A-1 to FIG. 13A-3 are microscopic pictures respectively showing two-dimensional photonic crystal layer in two-dimensional photonic crystal surface emitting laser of the third embodiment in which the wavelength $\lambda_L$ is 987.4 nm, the design value of the inclination angle θ is 30°, and the design value of the azimuthal angle ϕ is 0°, and FIG. 13B-1 to FIG. 13B-3 are respective far-field images of obtained inclined beams.

FIG. 14A, FIG. 14B, and FIG. 14C are graphs respectively showing measurement results of polarization properties of the inclined beams in FIG. 13B-1 to FIG. 13B-3.

FIG. 15A, FIG. 15B, and FIG. 15C are respective far-field images of inclined beams obtained using three two-dimensional photonic crystal surface emitting lasers of the third embodiment in which the wavelength $\lambda_L$ is 987.4 nm, the design value of the inclination angle θ is 30°, and the design values of the azimuthal angle are different.

DESCRIPTION OF EMBODIMENTS

Embodiments of a two-dimensional photonic crystal surface emitting laser according to the present invention are described with reference to FIG. 2 to FIG. 16.

First Embodiment

Figure 1A:
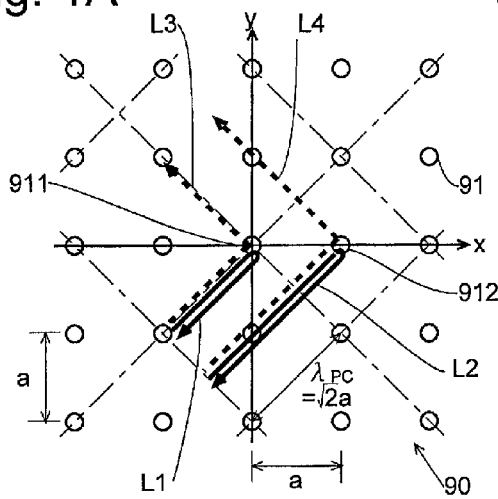
FIG. 1A and FIG. 1B are diagrams for describing the reason why a basic two-dimensional lattice amplifies light having a wavelength $\lambda_L$ (FIG. 1A) and prevents the light having the wavelength $\lambda_L$ from being emitted to the outside (FIG. 1B).
Figure 1B:
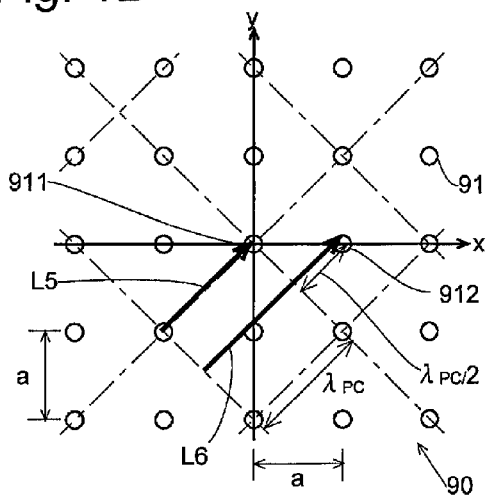
Figure 2:
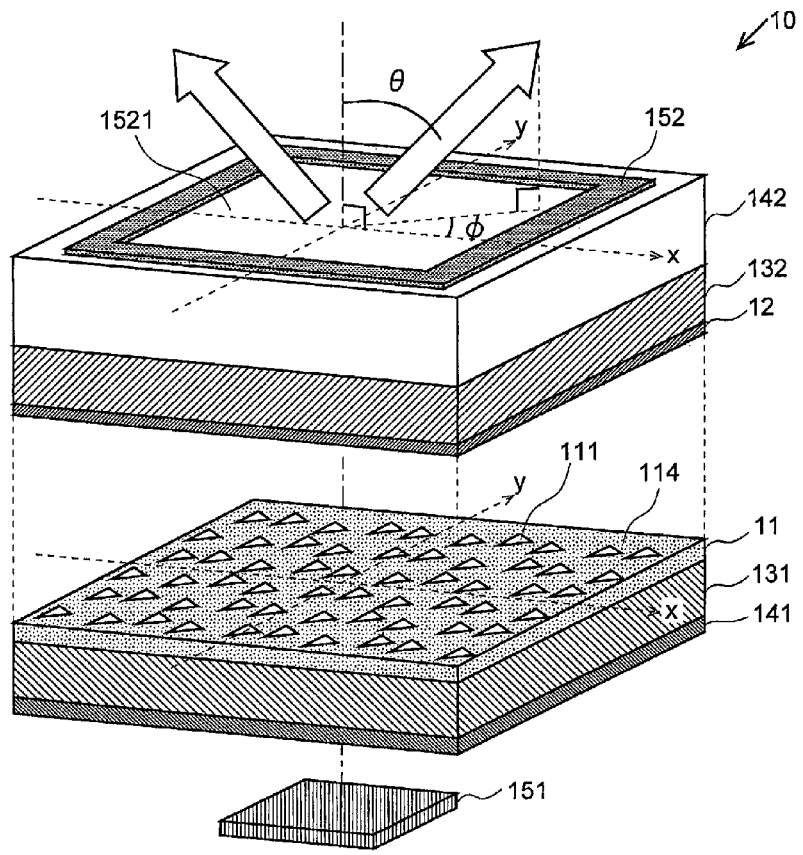
FIG. 2 is a perspective view showing a first embodiment of a two-dimensional photonic crystal surface emitting laser according to the present invention.

FIG. 2 is a perspective view of a two-dimensional photonic crystal surface emitting laser (which is hereinafter called the "photonic crystal laser") 10 of the first embodiment. This photonic crystal laser 10 includes a lower electrode 151, a lower substrate 141, a first cladding layer 131, a two-dimensional photonic crystal layer 11, an active layer 12, a second cladding layer 132, an upper substrate 142, and an upper electrode 152, which are laminated in the stated order. In the photonic crystal laser 10 of the present embodiment, a laser beam is emitted through a window (cavity) 1521 provided in a central part of the upper electrode 152, in a direction inclined by an emission angle θ from the normal to the two-dimensional photonic crystal layer 11. Instead of the electrode including the window 1521, a transparent electrode made of indium tin oxide (ITO) and the like may be used as the upper electrode 152. It should be noted that the two-dimensional photonic crystal layer 11 and the active layer 12 may be transposed. Moreover, although the words "upper" and "lower" are used in the present patent application for ease of explanation, these words do not specify the direction (up/down) in which the photonic crystal laser should actually be used. Moreover, a member such as a spacer may also be interposed between the active layer and the two-dimensional photonic crystal.

In the present embodiment, a p-type semiconductor of gallium arsenide (GaAs) was used for the lower substrate 141, an n-type GaAs was used for the upper substrate 142, a p-type semiconductor of aluminum gallium arsenide (AlGaAs) was used for the first cladding layer 131, and an n-type AlGaAs was used for the second cladding layer 132. The active layer 12 has a multiple-quantum well (MQW) structure made of indium gallium arsenide/gallium arsenide (InGaAs/GaAs). Gold was used as the material of each of the lower electrode 151 and the upper electrode 152. It should be noted that the materials of these layers are not limited to the aforementioned ones, and it is possible to use the same materials as those used for the respective layers of conventional photonic crystal surface emitting lasers. Other layers such as a spacer layer may also be interposed between the aforementioned layers.

The two-dimensional photonic crystal layer 11 is formed by arranging air holes (modified refractive index regions) 111 in a plate-shaped base member (slab) 114 as described later. In the present embodiment, a p-type GaAs was used as the material of the base member 114. In the present embodiment, the air holes 111 have an equilateral triangular shape (FIG. 3A), although it is possible to use a different shape, such as a circle. The material of the base member 114 is not limited to the aforementioned one, and any material used for the base member in conventional photonic crystal lasers is available. As the modified refractive index regions, members whose refractive index differs from that of the base member 114 (modified refractive index members) may be used instead of the air holes 111. Air holes are advantageous in that they can be easily processed, while modified refractive index members are preferable in the case where the base member may possibly be deformed due to a processing heat or other factors.

Figure 3A:
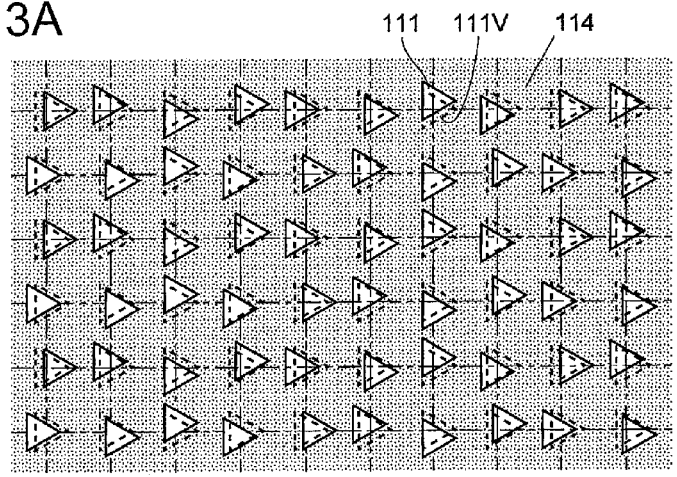
FIG. 3A is a top view showing a two-dimensional photonic crystal layer in a two-dimensional photonic crystal surface emitting laser of the first embodiment.
Figure 3B:
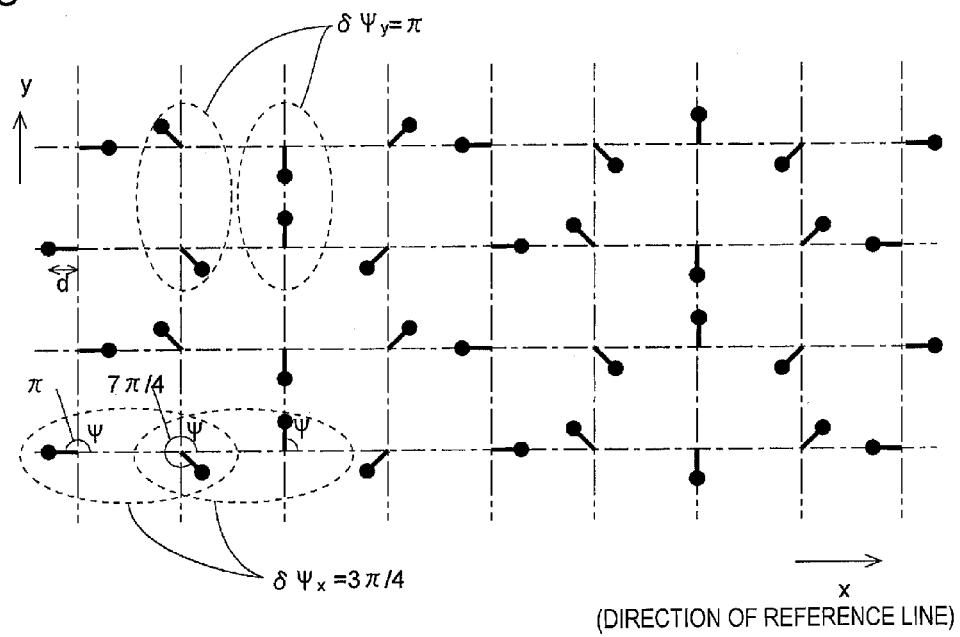
FIG. 3B is a partial enlarged view showing a square lattice as the basic two-dimensional lattice and the centers of gravity of air holes.

Arrangement of the air holes 111 in the base member 114 is described with reference to FIG. 3A and FIG. 3B. FIG. 3A is a top view of the two-dimensional photonic crystal layer 11. In FIG. 3A, the air holes 111 actually provided to the two-dimensional photonic crystal layer 11 are indicated by solid lines, a square lattice as a basic two-dimensional lattice is indicated by alternate long and short dash lines, and air holes 111V whose centers of gravity are virtually arranged at lattice points of the square lattice are indicated by broken lines. Moreover, FIG. 3B is an enlarged view of FIG. 3A, in which only the square lattice (alternate long and short dash lines) and the centers of gravity (black circles) of the air holes 111 are shown.

In the present embodiment, the distance (the distance d of the positional shift) between each lattice point and the center of gravity of each air hole 111V was set to be the same for all the lattice points, and the direction of the shift was modulated in the following manner.

The x direction was set to the direction of a reference line, and the design values of an inclined beam were set such that an inclination angle θ was 36.2° and that an azimuthal angle φ was 0°. Because Expression (2) includes a double sign ("±"), four values are obtained as a modulation phase, that is, the angle between the direction of the shift and the reference line (which is hereinafter called the "shift azimuthal angle Ψ"). Among the four values, $$\Psi=\Psi_{\theta=36.2°}=(3/4)\pi m_x+\pi m_y$$

was used here. In this case, the difference in the shift azimuthal angle Ψ between two lattice points neighboring in the x direction (which is hereinafter called "$\delta\Psi_x$") is (3/4)π, that is, 135°. Moreover, the difference in the shift azimuthal angle Ψ between two lattice points neighboring in the y direction (which is hereinafter called "$\delta\Psi_y$") is π, that is, 180°. Moreover, an effective refractive index $n_{eff}$ was set to 3.4.

Figure 4A:
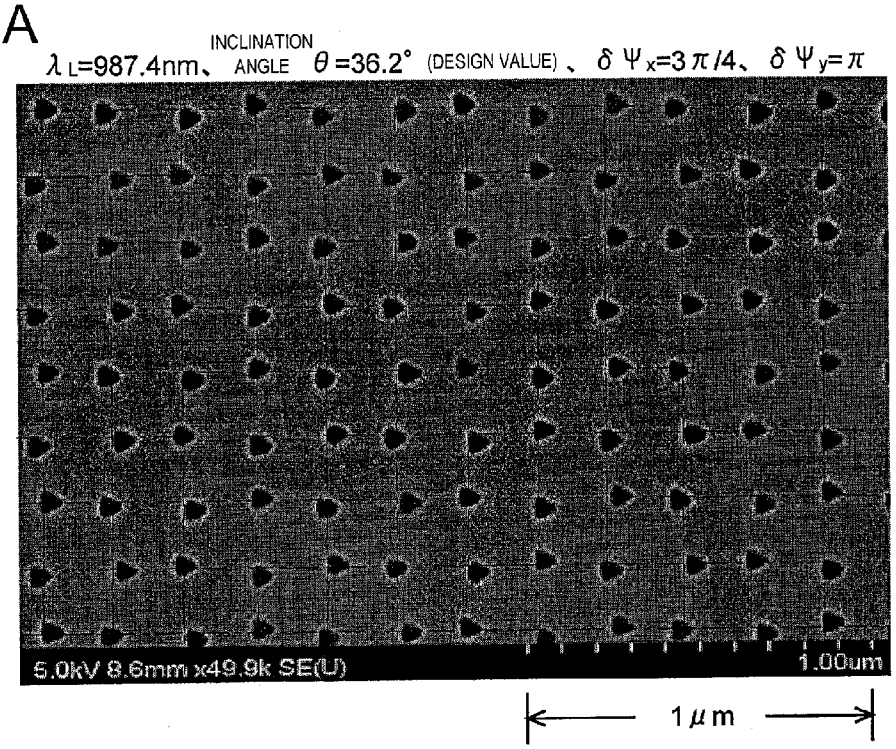
FIG. 4A is a microscopic picture showing a two-dimensional photonic crystal layer in a two-dimensional photonic crystal surface emitting laser of the first embodiment in which the wavelength $\lambda_L$ is 987.4 nm and the design value of an inclination angle θ is 36.2°.
Figure 4B:
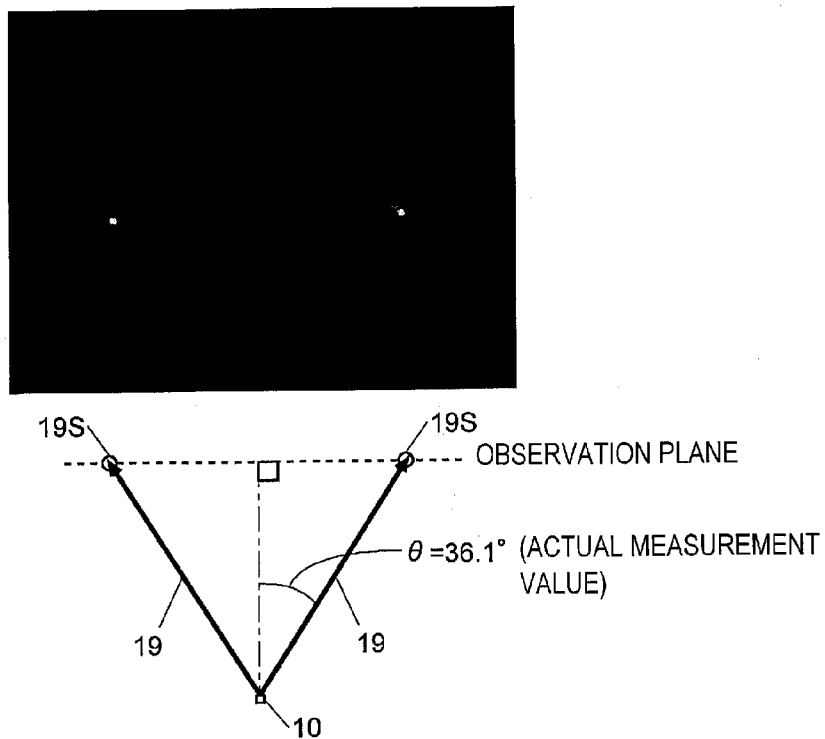
FIG. 4B is a far-field image of obtained inclined beam.

Then, actually produced was a photonic crystal laser including the two-dimensional photonic crystal layer 11 in which: the shift azimuthal angle Ψ was changed by 135° in the x direction and by 180° in the y direction between respective two neighboring lattice points; the effective refractive index $n_{eff}$ was 3.4; and the basic two-dimensional lattice was a square lattice having a lattice constant a of 208 nm. The distance d of the positional shift from the lattice point was set to 0.1a. An electron microscopic picture of the produced two-dimensional photonic crystal layer 11 is shown in FIG. 4A. When an electric current was injected into this photonic crystal laser, a laser beam having a wavelength of 987.4 nm was observed. As shown as a far-field image in FIG. 4B, this laser beam is an inclined beam 19 having an inclination angle θ of 36.1° (actual measurement value) with respect to the normal to the two-dimensional photonic crystal layer 11. The number of the observed inclined beams 19 was two (the number of inclined beam spots 19S was two). The difference between the actual measurement value and the design value of the inclination angle θ was 0.01°, which means that the obtained inclined beam was almost as designed.

In addition, similar experiments were carried out for examples in which: the lattice constant was the same as that in the aforementioned example (that is, a=208 nm); and the design values were set such that (i) θ=30° and φ=0° and that (ii) θ=40° and φ=0°. In these examples, $\delta\Psi_x$ is 0.7927π for (i) and 0.7337π for (ii). $\delta\Psi_y$ is π for both (i) and (ii). Microscopic pictures of the produced two-dimensional photonic crystal layers 11 are respectively shown in FIG. 5A-1 for (i) and FIG. 5A-2 for (ii). Far-field images of the inclined beams obtained by injecting electric currents into the photonic crystal lasers are respectively shown in FIG. 5B-1 for (i) and FIG. 5B-2 for (ii). In both the experiments, the obtained inclined beam had an inclination angle θ close to the design value. The actual measurement value of the inclination angle θ was 29.5° for (i) and 39.2° for (ii). An oscillation spectrum of the laser beam obtained using the photonic crystal laser of (i) is shown in FIG. 6. It can be confirmed that an oscillation wavelength $\lambda_L$ is 987.4 nm.

Figures 1, 7A:
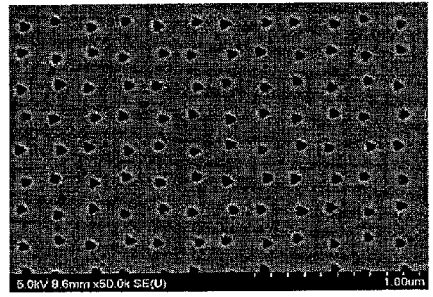
Figures 2, 7A:
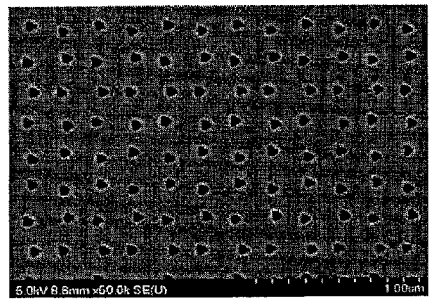
Figures 1, 7B:
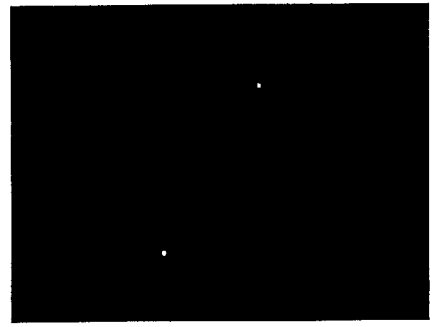
Figures 2, 7B:
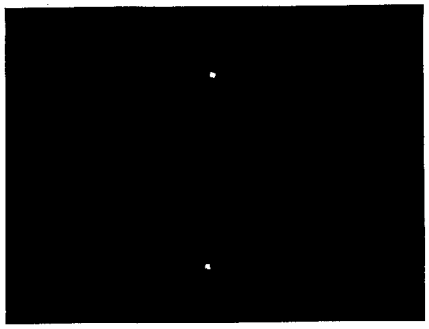

Further, for examples in which: the design value of the inclination angle θ was set to 30°; and the design values of the azimuthal angle φ were set to (i) 60° and (ii) 90°, microscopic pictures of the produced two-dimensional photonic crystal layers 11 are respectively shown in FIG. 7A-1 for (i) and FIG. 7A-2 for (ii), and far-field images of the inclined beams obtained by injecting electric currents into the photonic crystal lasers are respectively shown in FIG. 7B-1 for (i) and FIG. 7B-2 for (ii). For the inclined beams obtained in both the examples, the actual measurement value of the inclination angle θ was 29.5°, and the actual measurement value of the azimuthal angle φ was as designed.

Figure 8:
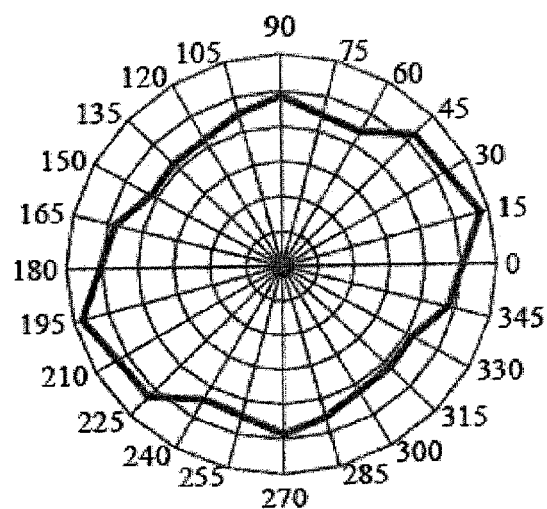
FIG. 8 is a graph showing a measurement result of a polarization property of the inclined beam obtained using the two-dimensional photonic crystal surface emitting laser of the first embodiment in which the wavelength $\lambda_L$ is 987.4 nm, the design value of the inclination angle θ is 30°, and the design value of the azimuthal angle is 60°.

For the photonic crystal laser in FIG. 7A-1 and FIG. 7B-1 in which the design values of the inclination angle θ and the azimuthal angle φ are θ=30° and φ=60°, the polarization direction of the observed inclined beam is shown in the graph of FIG. 8. This graph proves that light having a direction-independent intensity is detected, and means that the beam is circularly polarized light or unpolarized light (in which various rays of light having different vibration directions of electric field are mixed). In view of this, an experiment in which the beam was caused to pass through a quarter-wavelength plate and then pass through a polarizing plate was carried out. Here, the quarter-wavelength plate has a function of converting circularly polarized light into linearly polarized light. As a result of this experiment, as shown in FIG. 9A, FIG. 9B, FIG. 9C, and FIG. 9D, as the direction of the polarizing plate was changed, one of two laser spots disappeared in a particular direction (FIG. 9A). When the polarizing plate was further turned by 90°, the other of the two laser spots disappeared. This means that the inclined beam obtained in the present embodiment is not unpolarized light but has circularly polarization. The reason why each laser spot disappears is that the circularly polarized light of the inclined beam is converted into linearly polarized light by the quarter-wavelength plate and that the linearly polarized light is blocked by the polarizing plate arranged in a particular direction. Moreover, the fact that the direction of the polarizing plate when each laser spot disappears is different by 90° between the two laser beams means that one of the laser beams has right-handed circularly polarization while the other of the laser beams has left-handed circularly polarization. Based on such a fact that one of the laser beams is blocked, a laser light source that emits only one inclined beam can be obtained using the photonic crystal laser of the present invention and the combination of the quarter-wavelength plate and the polarizing plate.

Second Embodiment

Figure 10A:
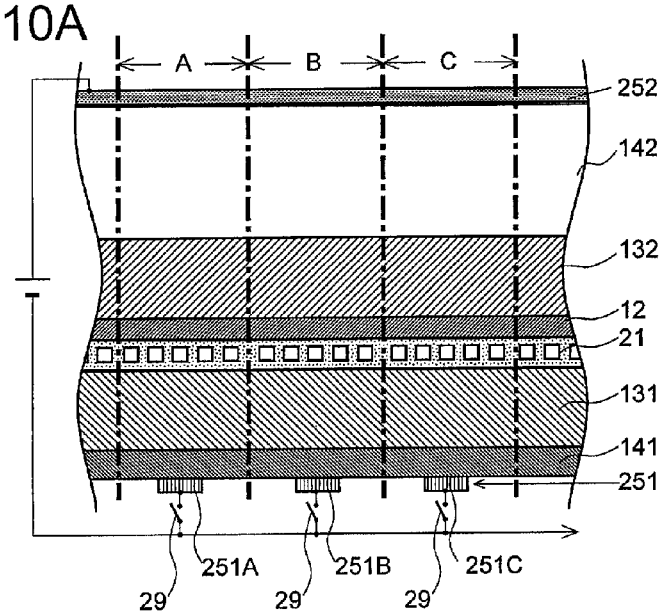
FIG. 10A is a longitudinal sectional view showing a variable beam-direction two-dimensional photonic crystal surface emitting laser of a second embodiment.

Next, an embodiment of a variable beam-direction two-dimensional photonic crystal surface emitting laser (which is hereinafter called the "variable beam-direction photonic crystal laser") 20 is described as the second embodiment. FIG. 10A is a longitudinal sectional view showing the variable beam-direction photonic crystal laser 20 of the second embodiment. In this embodiment, components similar to those in the photonic crystal laser 10 of the first embodiment are denoted by the same reference signs as those in the first embodiment, and detailed description thereof is omitted. The variable beam-direction photonic crystal laser 20 includes lower electrodes 251, the lower substrate 141, the first cladding layer 131, a two-dimensional photonic crystal layer 21, the active layer 12, the second cladding layer 132, the upper substrate 142, and an upper electrode 252, which are laminated in the stated order. In the present embodiment, a transparent electrode that covers the entire upper substrate 142 is used as the upper electrode 252.

Figure 10B:
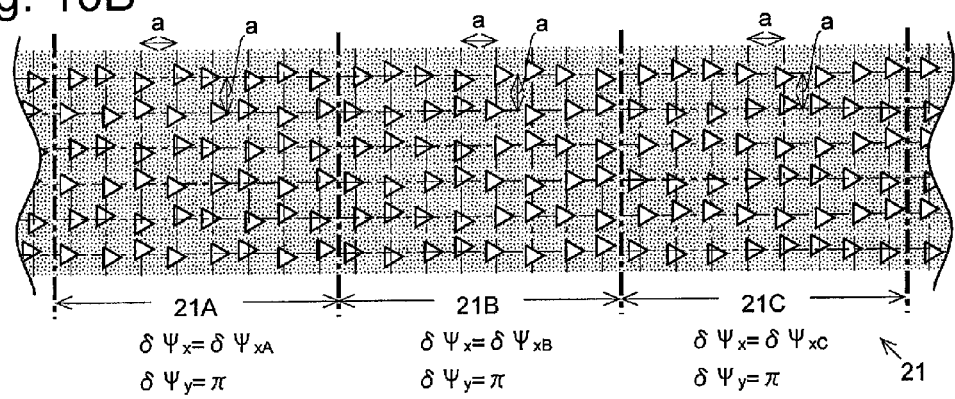
FIG. 10B is a plan view of a two-dimensional photonic crystal layer.

The variable beam-direction photonic crystal laser 20 is virtually divided into a plurality of regions (which are called the "modulation regions" and are different from the modified refractive index regions) A, B, C . . . . Lower electrodes 251A, 251B, 251C . . . are provided in the modulation regions so as to respectively correspond to the modulation regions and be independent of one another (FIG. 10A), and the structure of the two-dimensional photonic crystal layer 21 differs for each modulation region (FIG. 10B). Moreover, the variable beam-direction photonic crystal laser 20 is provided with current-injecting position controlling units 29 for switching the lower electrodes 251A, 251B, and 251C into which an electric current is to be injected. The other components have the same configurations for all the modulation regions. Both the lower electrodes and the modulation regions are one-dimensionally arranged.

In all of respective two-dimensional photonic crystal structures 21A, 21B, 21C . . . of the two-dimensional photonic crystal layer 21 in the modulation regions A, B, C . . . , the air holes 111 are respectively arranged at positions shifted in the direction of the shift azimuthal angle Ψ from the lattice points of the square lattice having the lattice constant a, and only the shift azimuthal angle Ψ differs for each two-dimensional photonic crystal structure. Here, for respective shift azimuthal angles $\Psi_A$, $\Psi_B$, $\Psi_C$ . . . in the modulation region A, B, C . . . , $\delta\Psi_x$ is set to take values $\delta\Psi_{xA}$, $\delta\Psi_{xB}$, and $\delta\Psi_{xC}$ that differ for each two-dimensional photonic crystal structure, and $\delta\Psi_y$ is set to π for all the two-dimensional photonic crystal structures.

In the variable beam-direction photonic crystal laser 20 of the present embodiment, an electric current is fed to between one of the lower electrodes 251A, 251B, 251C . . . and the upper electrode 252. Here, the emitting direction of the laser beam can be changed in the following manner by switching a lower electrode into which an electric current is to be fed.

First, description is given of an example case where an electric current is fed to between the lower electrode 251A and the upper electrode 252. When the electric current is fed in this way, light having the wavelength $\lambda_L$ is generated in a portion around directly above the lower electrode 251A, of the active layer 12. This light is amplified by the two-dimensional photonic crystal structure 21A lying directly above the portion. Then, an inclined beam is emitted at an inclination angle $\theta_A$ corresponding to the shift azimuthal angle $\Psi_A$ in the two-dimensional photonic crystal structure 21A.

Then, when the lower electrode to which the electric current is to be fed is switched from the lower electrode 251A to the lower electrode 251B, the light is amplified by the two-dimensional photonic crystal structure 21B this time, and an inclined beam is emitted at an inclination angle $\theta_B$ that is different from the inclination angle $\theta_A$ and corresponds to the shift azimuthal angle $\Psi_B$ in the two-dimensional photonic crystal structure 21B. Further, when the lower electrode to which the electric current is to be fed is switched to other lower electrodes such as the lower electrode 251C, the inclination angle θ similarly changes. In this way, an inclined beam can be emitted at a different inclination angle by switching the lower electrode to which the electric current is to be fed.

Figure 11A:
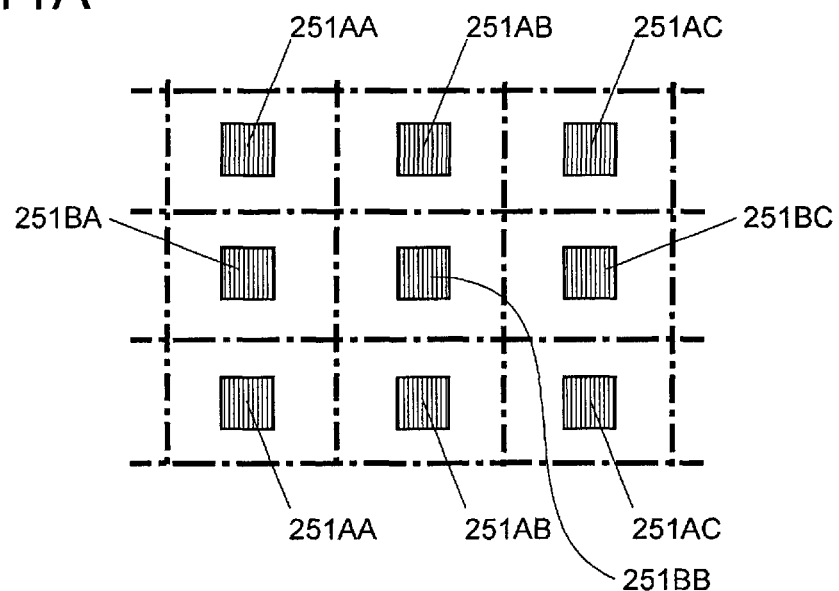
FIG. 11A is a plan view of two-dimensionally arranged lower electrodes included in a variable beam-direction two-dimensional photonic crystal surface emitting laser, which is a modified example of the second embodiment.
Figure 11B:
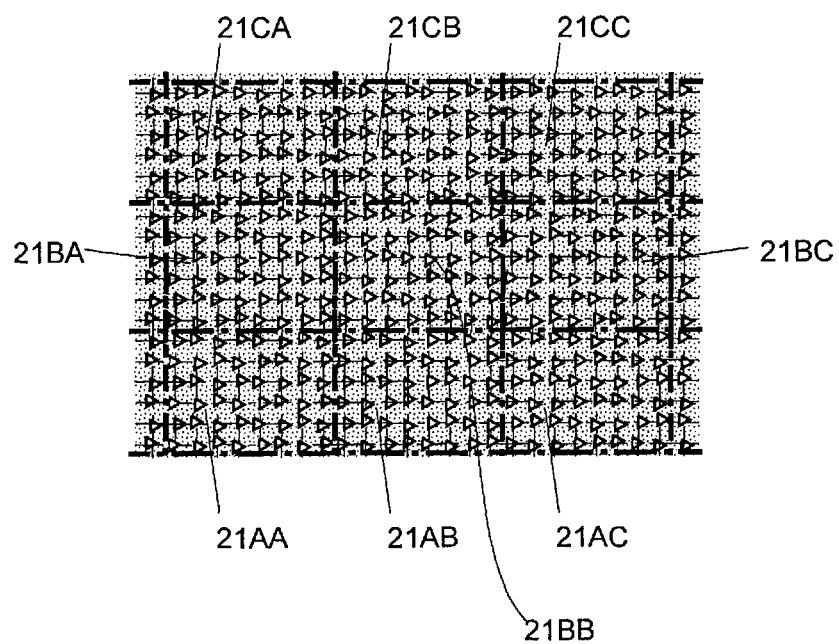
FIG. 11B is a plan view of a two-dimensional photonic crystal layer.

FIG. 11A and FIG. 11B show a modified example of the variable beam-direction photonic crystal laser. In this modified example, as shown in FIG. 11A, lower electrodes 251XY (X: A, B, C . . . , Y: A, B, C . . . ) are two-dimensionally arranged. As shown in FIG. 11B, two-dimensional photonic crystal structures XY (X: A, B, C . . . , Y: A, B, C . . . ) are two-dimensionally arranged in the two-dimensional photonic crystal layer 21 so as to respectively correspond to the lower electrodes 251XY. $\delta\omega_x$ is set to take values $\delta\Psi_{xXY}$ (X: A, B, C . . . , Y: A, B, C . . . ) that differ for each two-dimensional photonic crystal structure XY. In this variable beam-direction photonic crystal laser, an inclined beam can be emitted at a different inclination angle by switching the lower electrode 251XY to which an electric current is to be fed. Then, because the lower electrodes 251XY and the two-dimensional photonic crystal structures XY are two-dimensionally arranged, a larger number of combinations of the inclination angle θ and the azimuthal angle ϕ can be set than when they are one-dimensionally arranged.

Description is given above of the example in which one upper electrode is arranged and a large number of lower electrodes are one-dimensionally or two-dimensionally arranged. Alternatively, one lower electrode may be arranged whereas a large number of upper electrodes may be one-dimensionally or two-dimensionally arranged. A large number of lower electrodes and a large number of upper electrodes may both be one-dimensionally or two-dimensionally arranged.

Third Embodiment

In the third embodiment, description is given of an example in which: air holes (modified refractive index regions) are shifted in the same direction from lattice points of a basic two-dimensional lattice of a photonic crystal layer; and the distance of the shift is modulated. In the following, because the configuration excluding the photonic crystal layer is similar to that in the first embodiment, description thereof is omitted, and the configuration of the photonic crystal layer is described.

Figure 12A:
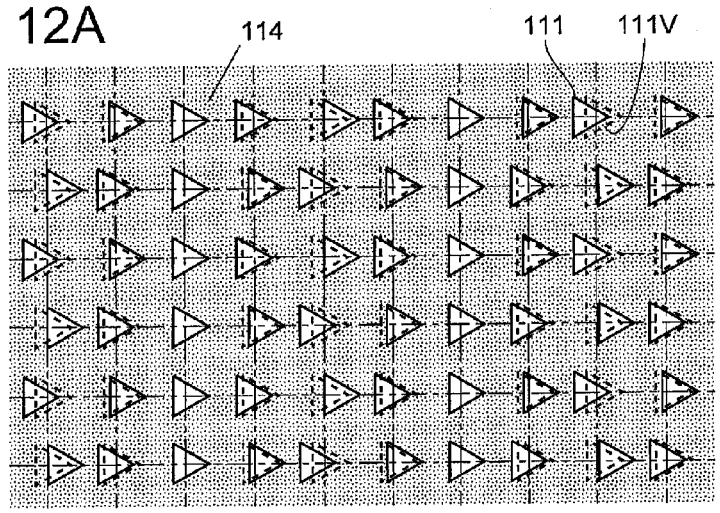
FIG. 12A is a top view showing a two-dimensional photonic crystal layer in a two-dimensional photonic crystal surface emitting laser of a third embodiment.
Figure 12B:
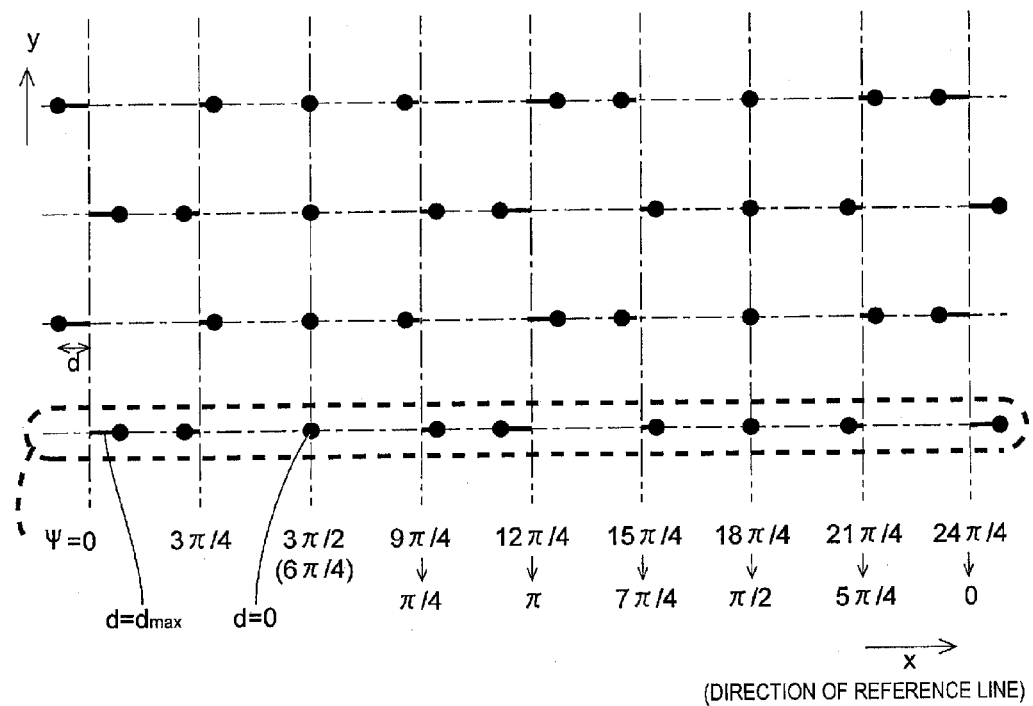
FIG. 12B is a partial enlarged view showing a square lattice as the basic two-dimensional lattice and the centers of gravity of air holes.

As shown in FIG. 12A, the basic two-dimensional lattice in the present embodiment is a square lattice similar to that in the first embodiment. The air holes 111 as the modified refractive index regions are respectively arranged at positions shifted from the lattice points of the basic two-dimensional lattice. As shown in FIG. 12B, the direction of the shift is the x direction as a reference direction, for all the air holes 111. Based on the modulation phase $\Psi$, the distance d of the shift is determined as d=$d_{max}$ cos $\Psi$, that is, determined such that |d| is modulated between 0 and its maximum value $d_{max}$. In the present embodiment, the modulation phase $\Psi$ was set such that the difference $\delta\Psi_x$ between lattice points neighboring in the x direction was $3\pi/4$. Because this value of $\delta\Psi_x$ is the same as an example of the value of $\delta\Psi_x$ given in the first embodiment, this variable beam-direction photonic crystal laser emits an inclined beam having an inclination angle $\theta$ of 36.2° similarly to the example given in the first embodiment. The modulation phase $\Psi$ (and the differences $\delta\Psi_x$ and $\delta\Psi_y$ in the modulation phase between neighboring lattice points) given here are mere examples, and may be set in accordance with the design values of the inclination angle $\theta$ and the azimuthal angle $\phi$, using Expression (2).

Description is given below of an example in which photonic crystal lasers of the third embodiment were produced, the photonic crystal lasers each including a two-dimensional photonic crystal layer in which: the effective refractive index $n_{eff}$ was 3.4; and the basic two-dimensional lattice was a square lattice having the lattice constant a of 206 nm. Here, produced were three photonic crystal lasers in which: the design values of the inclination angle $\theta$ of the laser beam and the azimuthal angle $\phi$ from the x direction were $\theta$=30° and $\phi$=0'; and the directions of the shift of each air hole were (1) the x direction, (2) the y direction, and (3) the 135-degree direction from the x direction. The values of $\delta\Psi_x$ and $\delta\Psi_y$ are as follows: $\delta\Psi_x$=0.792$\pi$ and $\delta\omega_y$=0 for (1); $\delta\Psi_x$=0 and $\delta\Psi_y$=0.792$\pi$ for (2); and $\delta\omega_x$=0.792$\pi$ and $\delta\Psi_y$=0.792$\pi$ for (3). In the present embodiment, the planar shape of each air hole formed in the photonic crystal layer was a circle. Electron microscopic pictures of the photonic crystal layers of these photonic crystal lasers are respectively shown in FIG. 13A-1 to FIG. 13A-3, and far-field images of the obtained inclined beams are respectively shown in FIG. 13B-1 to FIG. 13B-3. In all the examples, the obtained inclined beams each had $\theta$=30° and the azimuthal angle $\phi$=0° as designed.

For these three photonic crystal lasers, the polarization directions of the observed inclined beams are respectively shown in the graphs of FIG. 14A, FIG. 14B, and FIG. 14C. These graphs prove that: (1) when the air holes are shifted in the x direction, linearly polarized light in the y direction is obtained; (2) when the air holes are shifted in the y direction, linearly polarized light in the x direction is obtained; and (3) when the air holes are shifted in the 135-degree direction from the x direction, linearly polarized light in the 45-degree direction from the x direction is obtained. That is, it can be understood that linearly polarized light in the direction different by 90° from the direction of the shift of each air hole is obtained.

Next, produced were three photonic crystal lasers in which: the direction of the shift of each air hole was the x direction; the design value of the inclination angle $\theta$ of the laser beam was $\theta$=30°; and the design values of the azimuthal angle $\phi$ from the x direction were (1) 0°, (2) 45°, and (3) 90°. The values of $\delta\omega_x$ are 0.792$\pi$ for (1), 0.853$\pi$ for (2), and $\pi$ for (3). The value of $\delta\omega_y$ is 0° for all the examples. It is the same as the aforementioned example that the effective refractive index was 3.4 and that the basic two-dimensional lattice was a square lattice having the lattice constant a of 206 nm. Far-field images of the inclined beams obtained using these photonic crystal lasers are respectively shown in FIG. 15A, FIG. 15B and FIG. 15C. In all the examples, the obtained inclined beams each had the inclination angle $\theta$ and the azimuthal angle $\phi$ as designed.

Fourth Embodiment

In the fourth embodiment, description is given of an example in which: air holes (modified refractive index regions) are respectively arranged at lattice points such that their centers of gravity and the lattice points are coincident with each other; and the area of each air hole is modulated. Also in this embodiment, because the configuration excluding the photonic crystal layer is similar to that in the first embodiment, description thereof is omitted, and the configuration of the photonic crystal layer is described.

Figure 16:
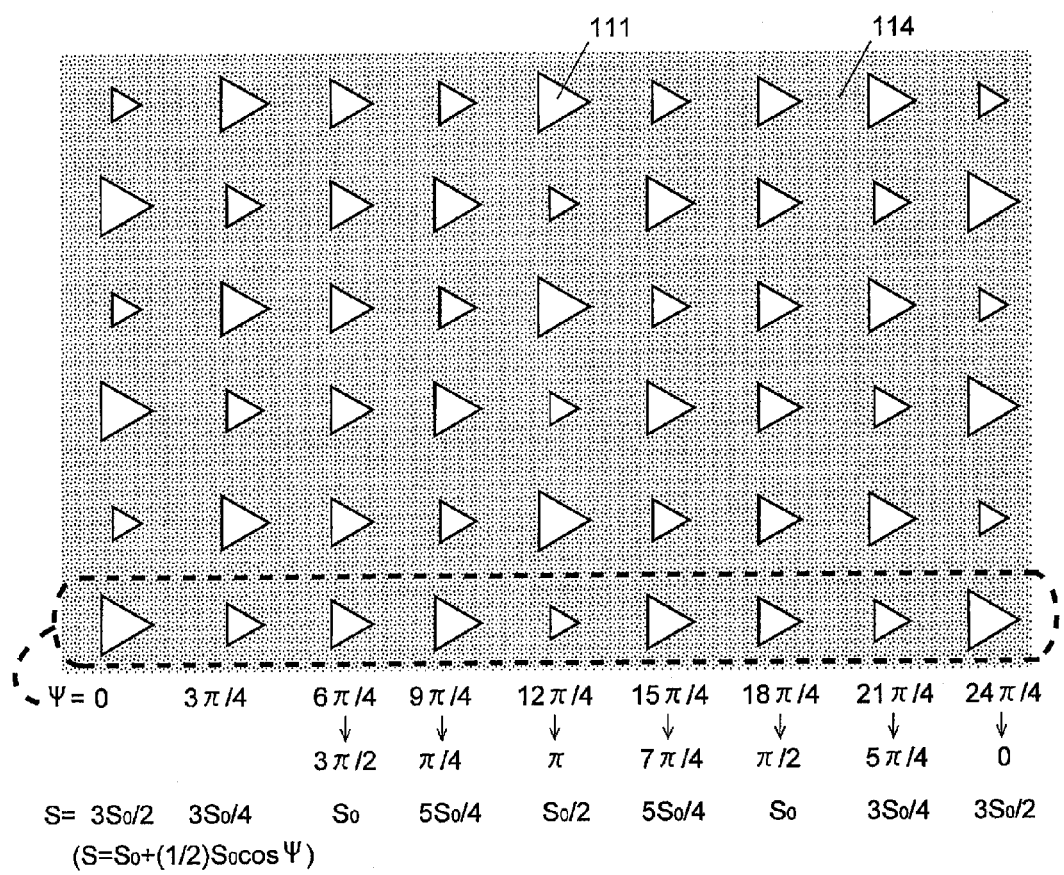
FIG. 16 is a top view showing a two-dimensional photonic crystal layer in a two-dimensional photonic crystal surface emitting laser of a fourth embodiment.

As shown in FIG. 16, the basic two-dimensional lattice in the present embodiment is a square lattice similar to that in the first embodiment. An area S of each air hole 111 is determined as S=$S_0$+S' cos $\Psi$, that is, determined so as to be modulated between its minimum value ($S_0$-S') and its maximum value ($S_0$+S'). In the present embodiment, the modulation phase $\Psi$ was set such that the difference $\delta\Psi_x$ between lattice points neighboring in the x direction was $3\pi/4$, similarly to the third embodiment. S' was set to (½)$S_0$. With such a configuration, the variable beam-direction photonic crystal laser of the present embodiment emits an inclined beam having an inclination angle $\theta$ of 36.2°, similarly to the third embodiment (and the example given in the first embodiment).

In each of the aforementioned embodiments, description is given of the example case where the basic two-dimensional lattice is a square lattice. Alternatively, in the track of these embodiments, modulation based on the modulation phase $\Psi$ shown in Expression (4) may be given in the case of a rectangular lattice, and modulation based on the modulation phase $\Psi$ shown in Expression (7) or (8) may be given in the case of a triangular lattice.

REFERENCE SIGNS LIST

10 . . . Photonic Crystal Laser
11, 21 . . . Two-Dimensional Photonic Crystal Layer
111 . . . Air Hole
111V . . . Virtual Air Hole
114 . . . Base Member
12 . . . Active Layer
131 . . . First Cladding Layer
132 . . . Second Cladding Layer
141 . . . Lower Substrate
142 . . . Upper Substrate
151, 251A, 251B, 251C, 251XY (X=A, B, C . . . , Y=A, B, C . . . ) . . . Lower Electrode
152, 252 . . . Upper Electrode
1521 . . . Window of Upper Electrode
19 . . . Inclined Beam
19S . . . Inclined Beam Spot
20 . . . Variable Beam-Direction Photonic Crystal Laser
21A, 21B, 21C, 21XY (X=A, B, C . . . , Y=A, B, C . . . ) . . . Two-Dimensional Photonic Crystal Structure
29 . . . Current-Injecting Position Controlling Unit
90 . . . Basic Two-Dimensional Lattice
91, 911, 912 . . . Lattice Point of Basic Two-Dimensional Lattice

The invention claimed is:

1. A two-dimensional photonic crystal surface emitting laser comprising a laminated structure including:
   an active layer for generating light having a wavelength $\lambda_L$ by receiving an injection of an electric current; and
   a two-dimensional photonic crystal layer in which refractive index distribution is formed by modified refractive index regions two-dimensionally arranged in a plate-shaped base member, where a refractive index of the modified refractive index regions differs from that of the base member,
   the two-dimensional photonic crystal surface emitting laser emitting a laser beam in a direction of an inclination angle $\theta$ from a normal to the two-dimensional photonic crystal layer, wherein
   the modified refractive index regions in the two-dimensional photonic crystal layer are modulated at respective lattice points of a basic two-dimensional lattice whose periodicity is determined such that a resonant state of the light having the wavelength $\lambda_L$ is created by forming a two-dimensional standing wave while the light having the wavelength $\lambda_L$ is prevented from being emitted to an outside, and
   a modulation phase $\Psi$ at each lattice point is expressed as $\Psi = \vec{r} \cdot \vec{G'}$ by using a position vector $\vec{r}$ of each lattice point and a reciprocal lattice vector $\vec{G'} = (g'_x, g'_y) = (k_x \pm |\vec{k}|(\sin\theta\cos\phi)/n_{\textit{eff}}, k_y \pm |\vec{k}|(\sin\theta\sin\phi)/n_{\textit{eff}})$, the reciprocal lattice vector $\vec{G'}$ being expressed by using:
   a wave vector $\vec{k} = (k_x, k_y)$ of the light having the wavelength $\lambda_L$ in the two-dimensional photonic crystal layer; an effective refractive index $n_{\textit{eff}}$ of the two-dimensional photonic crystal layer; and an azimuthal angle $\phi$ from a predetermined reference line of the basic two-dimensional lattice.

2. The two-dimensional photonic crystal surface emitting laser according to claim 1,
   wherein the modified refractive index region arranged at each lattice point is shifted by the same distance from the lattice point, and
   an angle to the predetermined reference line of the basic two-dimensional lattice is modulated based on the modulation phase $\Psi$, an angle representing a direction of a shift.

3. The two-dimensional photonic crystal surface emitting laser according to claim 1,
   wherein the modified refractive index region arranged at each lattice point is shifted in the same direction from the lattice point, and
   an absolute value of a distance d of a shift is modulated between zero and a maximum value $d_{max}$, based on the modulation phase $\Psi$.

4. The two-dimensional photonic crystal surface emitting laser according to claim 1,
   wherein the modified refractive index regions are arranged at each lattice point, and
   an area S of each modified refractive index region is modulated between a minimum value $(S_0 - S')$ and a maximum value $(S_0 + S')$, based on the modulation phase $\Psi$.

5. The two-dimensional photonic crystal surface emitting laser according to claim 1, further comprising a current-injecting position controller for controlling a current-injecting position at which the electric current is injected into the active layer, wherein
   the modulation phase $\Psi$ of each lattice point differs for each modulation region in the two-dimensional photonic crystal layer, the modulation region being a region in which light emission from the current-injecting position is amplified.

6. The two-dimensional photonic crystal surface emitting laser according to claim 5, wherein the current-injecting position controller includes:
   a plurality of electrodes including a pair of electrodes arranged so as to sandwich the active layer and the two-dimensional photonic crystal layer, one or both of the pair of electrodes being two-dimensionally arranged in parallel to the active layer and the two-dimensional photonic crystal layer; and
   a switch for switching electrodes for injecting the electric current into the active layer, among the plurality of electrodes.

7. The two-dimensional photonic crystal surface emitting laser according to claim 2, further comprising a current-injecting position controller for controlling a current-injecting position at which the electric current is injected into the active layer, wherein
   the modulation phase $\Psi$ of each lattice point differs for each modulation region in the two-dimensional photonic crystal layer, the modulation region being a region in which light emission from the current-injecting position is amplified.

8. The two-dimensional photonic crystal surface emitting laser according to claim 3, further comprising a current-injecting position controller for controlling a current-injecting position at which the electric current is injected into the active layer, wherein
   the modulation phase $\Psi$ of each lattice point differs for each modulation region in the two-dimensional photonic crystal layer, the modulation region being a region in which light emission from the current-injecting position is amplified.

9. The two-dimensional photonic crystal surface emitting laser according to claim 4, further comprising a current-injecting position controller for controlling a current-injecting position at which the electric current is injected into the active layer, wherein
   the modulation phase $\Psi$ of each lattice point differs for each modulation region in the two-dimensional photonic crystal layer, the modulation region being a region in which light emission from the current-injecting position is amplified.

10. The two-dimensional photonic crystal surface emitting laser according to claim 7, wherein the current-injecting position controller includes:
    a plurality of electrodes including a pair of electrodes arranged so as to sandwich the active layer and the two-dimensional photonic crystal layer, one or both of the pair of electrodes being two-dimensionally arranged in parallel to the active layer and the two-dimensional photonic crystal layer; and
    a switch for switching electrodes for injecting the electric current into the active layer, among the plurality of electrodes.

11. The two-dimensional photonic crystal surface emitting laser according to claim 8, wherein the current-injecting position controller includes:
    a plurality of electrodes including a pair of electrodes arranged so as to sandwich the active layer and the two-dimensional photonic crystal layer, one or both of the pair of electrodes being two-dimensionally arranged in parallel to the active layer and the two-dimensional photonic crystal layer; and a switch for switching electrodes for injecting the electric current into the active layer, among the plurality of electrodes.

12. The two-dimensional photonic crystal surface emitting laser according to claim 9, wherein the current-injecting position controller includes:
a plurality of electrodes including a pair of electrodes arranged so as to sandwich the active layer and the two-dimensional photonic crystal layer, one or both of the pair of electrodes being two-dimensionally arranged in parallel to the active layer and the two-dimensional photonic crystal layer; and
a switch for switching electrodes for injecting the electric current into the active layer, among the plurality of electrodes.

* * * * *